(12) United States Patent
Mita

(10) Patent No.: US 8,729,662 B2
(45) Date of Patent: May 20, 2014

(54) SEMICONDUCTOR DEVICE AND MANUFACTURING METHOD THEREOF

(75) Inventor: Keiji Mita, Isesaki (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 429 days.

(21) Appl. No.: 12/209,906

(22) Filed: Sep. 12, 2008

(65) Prior Publication Data

US 2010/0065945 A1    Mar. 18, 2010

(51) Int. Cl.
    *H01L 29/00*    (2006.01)

(52) U.S. Cl.
    USPC ........... 257/517; 257/544; 257/545; 257/546; 257/547; 257/E21.545

(58) Field of Classification Search
    CPC ... H01L 21/76; H01L 21/761; H01L 21/8222; H01L 21/823481; H01L 29/0649; H01L 29/7829
    USPC .......... 438/356–358; 257/517–564, E21.545
    See application file for complete search history.

(56) References Cited

U.S. PATENT DOCUMENTS

| 4,190,949 | A | * | 3/1980 | Ikeda et al. | 438/348 |
| 4,786,614 | A | * | 11/1988 | Cogan | 438/421 |
| 5,156,989 | A | * | 10/1992 | Williams et al. | 438/206 |
| 5,243,214 | A | * | 9/1993 | Sin et al. | 257/372 |
| 5,801,085 | A | * | 9/1998 | Kim et al. | 438/524 |
| 7,700,405 | B2 | | 4/2010 | Min et al. | |
| 2005/0045979 | A1 | * | 3/2005 | Morioka et al. | 257/432 |
| 2005/0161744 | A1 | | 7/2005 | Frapreau et al. | |
| 2005/0207077 | A1 | * | 9/2005 | Xu et al. | 361/56 |
| 2006/0231890 | A1 | * | 10/2006 | Glenn et al. | 257/338 |
| 2010/0052101 | A1 | | 3/2010 | Mita | |
| 2010/0164056 | A1 | | 7/2010 | Min et al. | |

FOREIGN PATENT DOCUMENTS

| JP | 61-245573 | | 10/1986 |
| JP | 09-097852 | | 4/1997 |
| JP | 09-097853 | | 4/1997 |
| WO | WO 2007057803 | A1 * | 5/2007 |

\* cited by examiner

*Primary Examiner* — H Tsai

(57) ABSTRACT

A semiconductor integrated circuit is reduced in size by suppressing lateral extension of an isolation region when impurities are thermally diffused in a semiconductor substrate to form the isolation region. Boron ions (B+) are implanted into an epitaxial layer through a third opening K3 to form a P-type impurity region, using a third photoresist as a mask. Then a fourth photoresist is formed on a silicon oxide film to have fourth openings K4 (phosphorus ion implantation regions) that partially overlap the P-type impurity region. Phosphorus ions (P+) are implanted into the surface of the epitaxial layer in etched-off regions using the fourth photoresist as a mask to form N-type impurity regions that are adjacent the P-type impurity region. After that, a P-type upper isolation region is formed in the epitaxial layer by thermal diffusion so that the upper isolation region and a lower isolation region are combined together to make an isolation region.

8 Claims, 5 Drawing Sheets

SEMICONDUCTOR DEVICE AND MANUFACTURING METHOD THEREOF

BACKGROUND OF THE INVENTION

1. Field of the Invention

This invention relates to a semiconductor device and its manufacturing method, specifically to a technology to form an isolation region for a semiconductor element.

2. Description of the Related Art

In a semiconductor integrated circuit, an isolation region to electrically isolate a semiconductor element such as a bipolar transistor from other semiconductor elements is conventionally formed by introducing impurities into a semiconductor substrate and thermally diffusing the impurities. Technologies for this kind of forming of the isolation region are disclosed in Japanese Patent Application Publication Nos. H09-97852 and H09-97853, for example.

When the impurities introduced into the semiconductor substrate are thermally diffused, however, a lateral diffusion is caused along with a vertical diffusion (a diffusion toward a depth of the semiconductor substrate), which raises a problem that the isolation region and a well region require a large pattern area that makes reducing a size of the semiconductor integrated circuit difficult.

SUMMARY OF THE INVENTION

The invention provides a method of manufacturing a semiconductor device. The method includes providing a semiconductor substrate of a first general conductivity type, forming a semiconductor layer of a second general conductivity type on the semiconductor substrate, forming a lower isolation region of the first general conductivity type in a lower portion of the semiconductor layer, forming a first impurity region of the first general conductivity type by introducing impurities of the first general conductivity type into part of the semiconductor layer, forming a second impurity region of the second general conductivity type adjacent the first impurity region by introducing impurities of the second general conductivity type into part of the semiconductor layer, and thermally diffusing the impurities in the first impurity region and the impurities in the second impurity region to form an upper isolation region of the first general conductivity type in the semiconductor layer so that the upper isolation region and the lower isolation region are combined together to make an isolation region.

The invention also provides a semiconductor device that includes a semiconductor substrate of a first general conductivity type, a semiconductor layer of a second general conductivity type disposed on the semiconductor substrate, and an isolation region of the first general conductivity type formed in the semiconductor layer so as to surround and electrically isolate a portion of the semiconductor layer. The width of the upper end of the isolation region and the width of the lower end of the isolation region are smaller than the width of the center of the isolation region.

DETAILED DESCRIPTION OF THE INVENTION

Figure 1A:
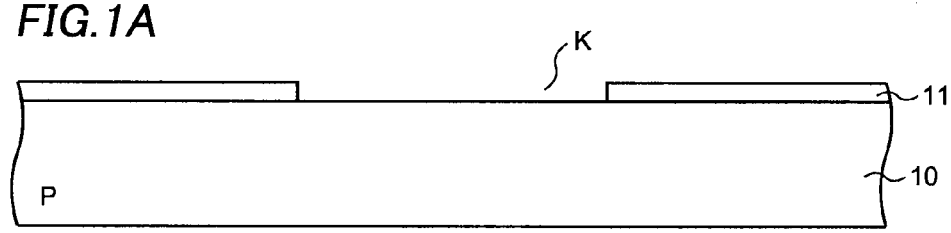
FIGS. 1A, 1B, 1C and 1D are cross-sectional views showing a manufacturing method of a semiconductor device according to an embodiment of this invention.

A method of manufacturing a semiconductor device according to an embodiment of this invention is described referring to the drawings. First, a P-type single crystalline silicon substrate (hereafter referred to as a substrate) 10 is provided as shown in FIG. 1A. A silicon oxide film 11 is formed by thermally oxidizing a surface of the substrate 10. An opening K for impurity injection is formed in the silicon oxide film 11 by applying a photoresist on the silicon oxide film 11, masked exposure and development of the photoresist and etching of the silicon oxide film 11 using the photoresist as a mask.

Figure 1B:
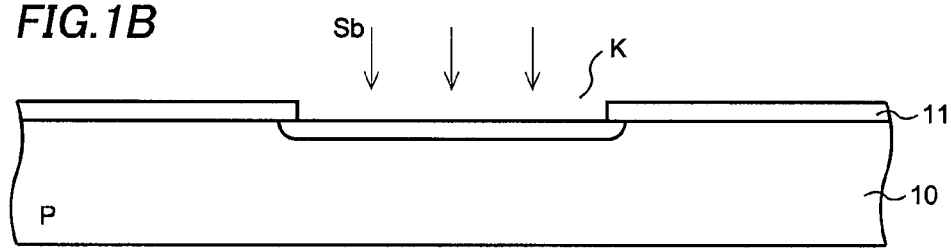
Figure 1C:
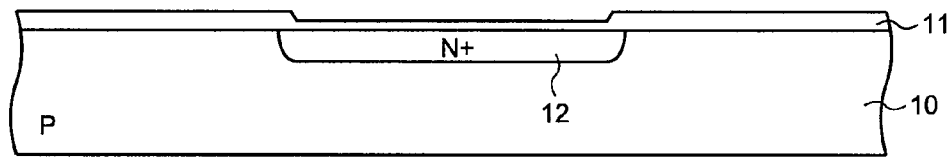
Figure 1D:
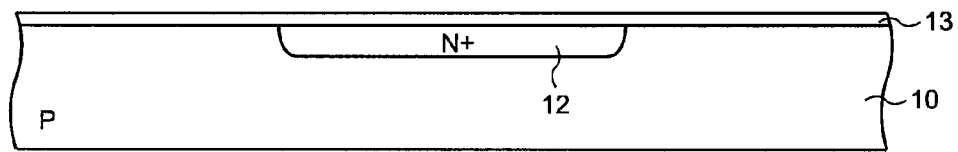

After removing the photoresist, antimony impurities (Sb) are introduced into the substrate 10 through the opening K using the silicon oxide film 11 as a mask, as shown in FIG. 1B. Then, an N+-type diffusion layer 12, which is to make an N+-type buried layer in a later process step, is formed by thermally diffusing the antimony impurities in an oxygen atmosphere, as shown in FIG. 1C. After removing the silicon oxide film 11, a silicon oxide film 13 having a thickness of 200 nm is formed on the surface of the substrate 10 by thermal oxidation, as shown in FIG. 1D.

Figure 2A:
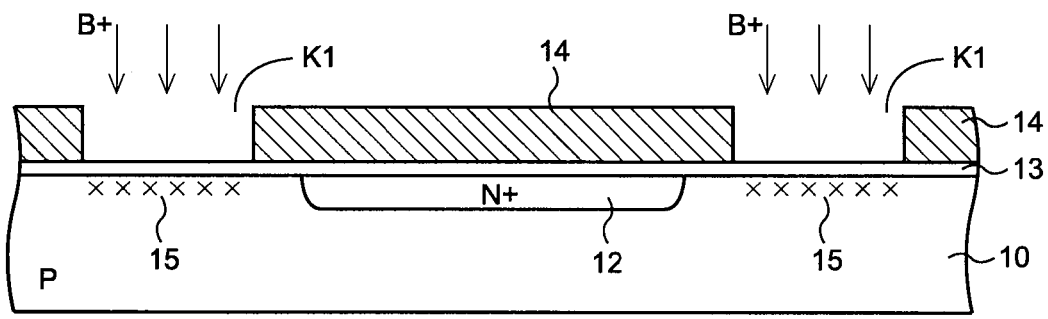
FIGS. 2A, 2B, 2C and 2D are cross-sectional views showing the manufacturing method of the semiconductor device according to the embodiment of this invention.

Next, a first photoresist 14 having a first opening K1 (boron ion implantation region) is formed on the silicon oxide film 13, as shown in FIG. 2A. When looked from above the substrate 10, the first opening K1 is ring-shaped and surrounds the N+-type diffusion layer 12. A width of the first opening K1 (boron ion implantation region) is 5 µm.

Boron ions (B+) are implanted into the surface of the substrate 10 through the silicon oxide film 13 in the first opening K1 to form a P-type impurity region 15, using the first photoresist 14 as a mask. At that time, it is preferable that a peak of a concentration distribution of the boron ions (B+) is placed at the surface of the substrate 10. The boron ions (B+) are implanted at an acceleration energy of 80 KeV and at a dose of $5 \times 10^{14}/cm^2$, for example.

It is noted that conductivity types such as N+, N and N− belong in one general conductivity type, and conductivity types such as P+, P and P− belong in anther general conductivity type.

Figure 2B:
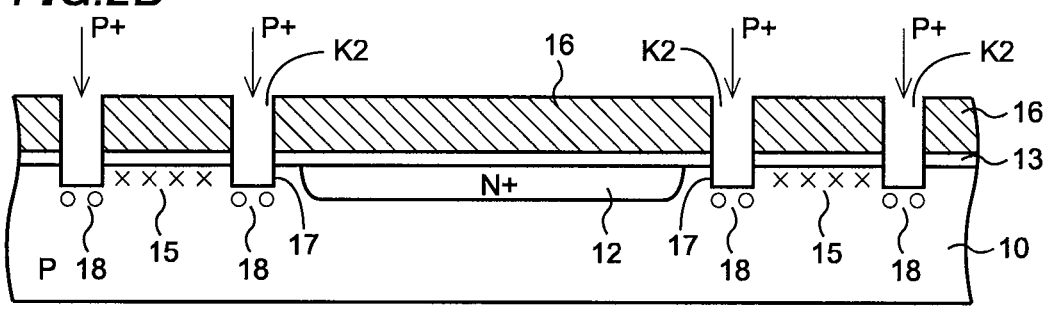

After removing the first photoresist 14, a second photoresist 16 is formed on the silicon oxide film 13, as shown in FIG. 2B. The second photoresist 16 is formed to have second openings K2 (phosphorus ion implantation regions) on both sides of the P-type impurity region 15 so that the second openings K2 partially overlap the P-type impurity region 15. The second openings K2 are formed in a shape of double rings that encompass the P-type impurity region 15 from both sides.

The silicon oxide film 13 is selectively etched off using the second photoresist 16 as a mask. It is preferable that the P-type impurity region 15 is partially removed by further etching the underlying surface of the substrate 10. The etching forms depressed portions 17 in the surface of the substrate 10 adjacent the P-type impurity region 15.

Then, phosphorus ions (P+) are implanted into the surface of the substrate 10 in the etched-off regions using the second photoresist 16 as a mask to form an N-type impurity regions 18 that are adjacent the P-type impurity region 15. A width of each of the second openings K2 (phosphorus ion implantation regions) is 2 μm. The phosphorus ions (P+) are implanted at an acceleration energy of 110 KeV and at a dose of $5 \times 10^{14}/\text{cm}^2$, for example.

When each of the second openings K2 overlaps the P-type impurity region 15 by 0.5 μm, a width of the P-type impurity region 15 is reduced to 4 μm. A width of each of the N-type impurity regions 18 on both sides of the P-type impurity region 15 is 2 μm.

Figure 2C:
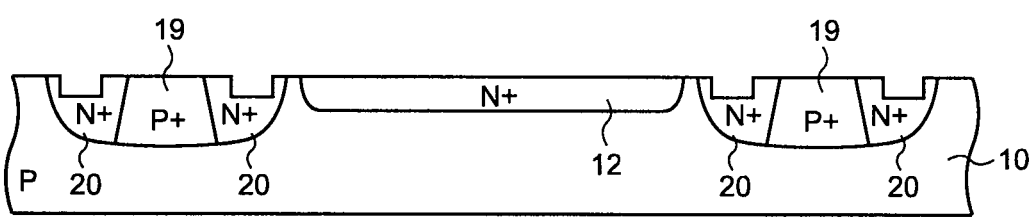

After removing the second photoresist 16, the impurities in the P-type impurity region 15 and the impurities in the N-type impurity regions 18 are thermally diffused, as shown in FIG. 2C. The thermal diffusion is carried out at 1180° C. for 2 hours.

With this, a P+-type diffusion layer 19 and N+-type diffusion layers 20 encompassing both sides of the P+-type diffusion layer 19 are formed in the substrate 10. At that time, lateral extension of the P+-type diffusion layer 19 is suppressed because some of the boron impurities (B) are compensated by the phosphorus impurities (P) from the N-type impurity regions 18.

Figure 2D:
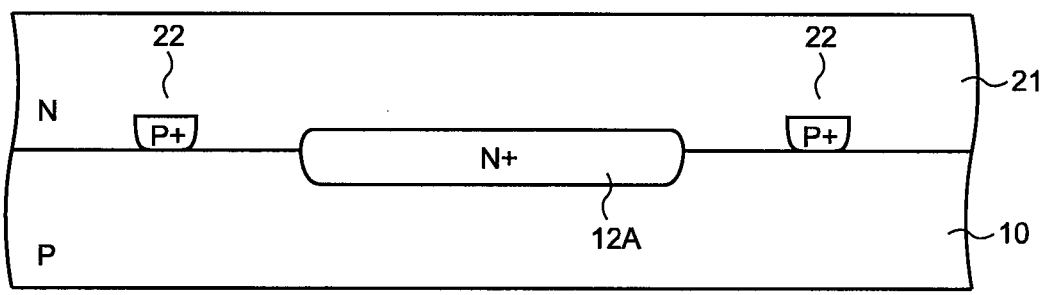

After that, an N-type epitaxial layer 21 of a thickness of 10 μm is formed all over the substrate 10 by vapor phase epitaxy, as shown in FIG. 2D. The vapor phase epitaxy is carried out at 1120-1140° C. for 15-30 minutes. The antimony impurities (Sb) that have been introduced into the substrate 10 are diffused upward into the N-type epitaxial layer 21 during the vapor phase epitaxy to form an N+-type buried layer 12A around an interface between the substrate 10 and the epitaxial layer 21. At the same time, the impurities in the P+-type diffusion layer 19 are also diffused upward to form a P+-type lower isolation region 22. An upper end of the P+-type lower isolation region 22 reaches partway through the thickness of the epitaxial layer 21. At that time, some of the boron impurities (B) are compensated by phosphorus impurities (P) diffused from the N+-type diffusion layer 20 to suppress lateral extension of the P+-type lower isolation region 22.

The P-type impurity region 15 and the N-type impurity regions 18 are formed adjacent to and self-aligned with each other, since the N-type impurity regions 18 are formed so as to overlap regions where the P-type impurity region 15 has been formed and then removed by the partial etching as described above. With this, impurity profiles in the P-type impurity region 15 and the N-type impurity regions 18 are consistent even when the second photoresist 16 is misaligned to some extent with the first photoresist 14, and a variation in an impurity profile in the P+-type lower isolation region 22 after the thermal diffusion can be suppressed.

As a result of using boron (B) and phosphorus (P) as the impurities, a width of the lower isolation region 22 is formed smaller at a bottom (an interface between the epitaxial layer 21 and the substrate 10) than a width of the lower isolation region 22 at an upper portion. A diffusion coefficient of boron (B) in silicon is larger than a diffusion coefficient of phosphorus (P) in silicon at 1100° C. and above. A difference between the diffusion coefficients is even greater at 1180° C.

Since boron (B) diffuses upward faster than phosphorus (P), the width of the lower isolation region 22 is smaller at an upper portion of the epitaxial layer 21. That is, the width of the lower isolation region becomes larger at the upper portion. On the other hand, boron (B) is more likely compensated by phosphorus (P) in the vicinity of the interface between the epitaxial layer 21 and the substrate 10 because phosphorus (P) diffuses slower than boron (B). With this, lateral extension of the lower isolation region 22 is strongly suppressed to reduce its width. Due to a characteristic impurity profile in the lower isolation region 22 as described above, the pattern area of the lower isolation region 22 can be reduced while avoiding interference with the N+-type buried layer 12A. Note that the P+-type diffusion layer 19, the N+-type diffusion layers 20 and the depressed portions 17 are omitted and not shown in FIG. 2D and in the drawings thereafter.

Figure 3A:
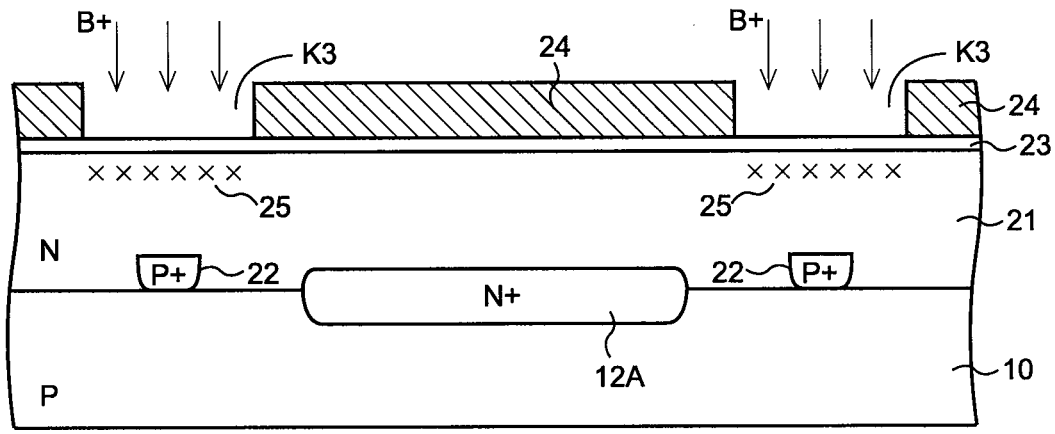
FIGS. 3A, 3B and 3C are cross-sectional views showing the manufacturing method of the semiconductor device according to the embodiment of this invention.

Next, process steps to form an upper isolation region will be described referring to FIGS. 3A, 3B and 3C. First, a silicon oxide film 23 having a thickness of 200 nm is formed on a surface of the epitaxial layer 21 by thermal oxidation, as shown in FIG. 3A. A third photoresist 24 having a third opening K3 (boron ion implantation region) is formed on the silicon oxide film 23. As the first opening K1 in the first photoresist 14, the third opening K3 in the third photoresist 24 is ring-shaped and surrounds the N+-type buried layer 12A. The third opening K3 is 5 μm wide with its center approximately coincident with a center of the lower isolation region 22.

Boron ions (B+) are implanted into the surface of the epitaxial layer 21 through the silicon oxide film 23 in the third opening K3 to form a P-type impurity region 25, using the third photoresist 24 as a mask. At that time, it is preferable that a peak of a concentration distribution of the boron ions (B+) is placed at the surface of the epitaxial layer 21. The boron ions (B+) are implanted at an acceleration energy of 80 KeV and at a dose of $5 \times 10^{14}/\text{cm}^2$, for example.

Figure 3B:
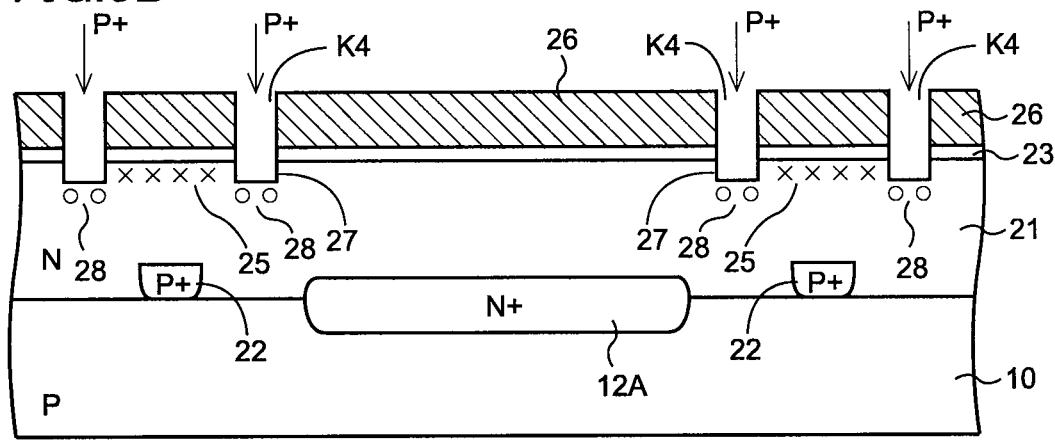

After removing the third photoresist 24, a fourth photoresist 26 is formed on the silicon oxide film 23, as shown in FIG. 3B. The fourth photoresist 26 is formed to have fourth openings K4 (phosphorus ion implantation regions) on both sides of the P-type impurity region 25 so that the fourth openings K4 partially overlap the P-type impurity region 25.

The silicon oxide film 23 is selectively etched off using the fourth photoresist 26 as a mask. It is preferable that the P-type impurity region 25 is partially removed by further etching the underlying epitaxial layer 21. The etching forms depressed portions 27 in the surface of the epitaxial layer 21 adjacent the P-type impurity region 25.

Then, phosphorus ions (P+) are implanted into the surface of the epitaxial layer 21 in the etched-off regions using the fourth photoresist 26 as a mask to form N-type impurity regions 28 that are adjacent the P-type impurity region 25. A width of each of the fourth openings K4 (phosphorus ion implantation region) is 2 μm. The phosphorus ions (P+) are implanted at an acceleration energy of 110 KeV and at a dose of $5 \times 10^{14}/\text{cm}^2$, for example.

When each of the fourth openings K4 overlaps the P-type impurity region 25 by 0.5 μm, a width of the P-type impurity region 25 is reduced to 4 μm. A width of each of the N-type impurity regions 28 on both sides of the P-type impurity region 25 is 2 μm.

Figure 3C:
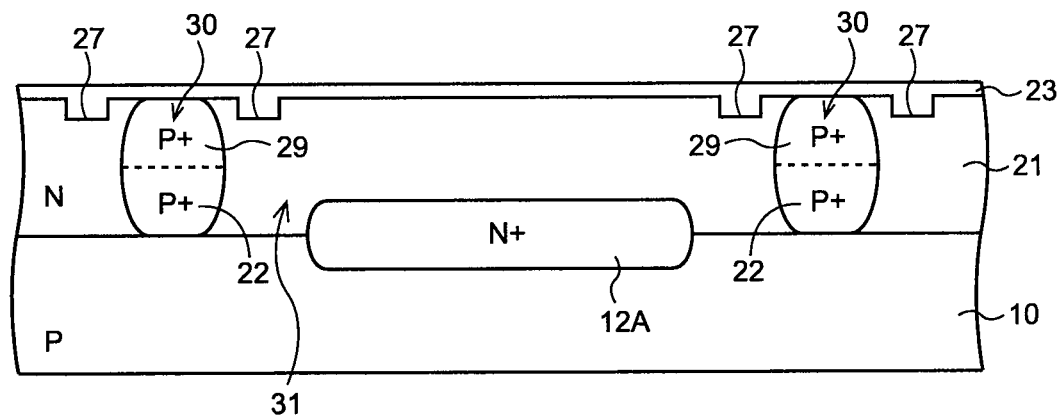

After removing the fourth photoresist 26, the impurities in the P-type impurity region 25 and the impurities in the N-type impurity regions 28 are thermally diffused, as shown in FIG. 3C. The thermal diffusion is carried out at 1180° C. for 2 hours. With this, a P+-type upper isolation region 29 is formed in the epitaxial layer 21. The upper isolation region 29 and the lower isolation region 22 are connected with each other and together make an isolation region 30.

Figure 5:
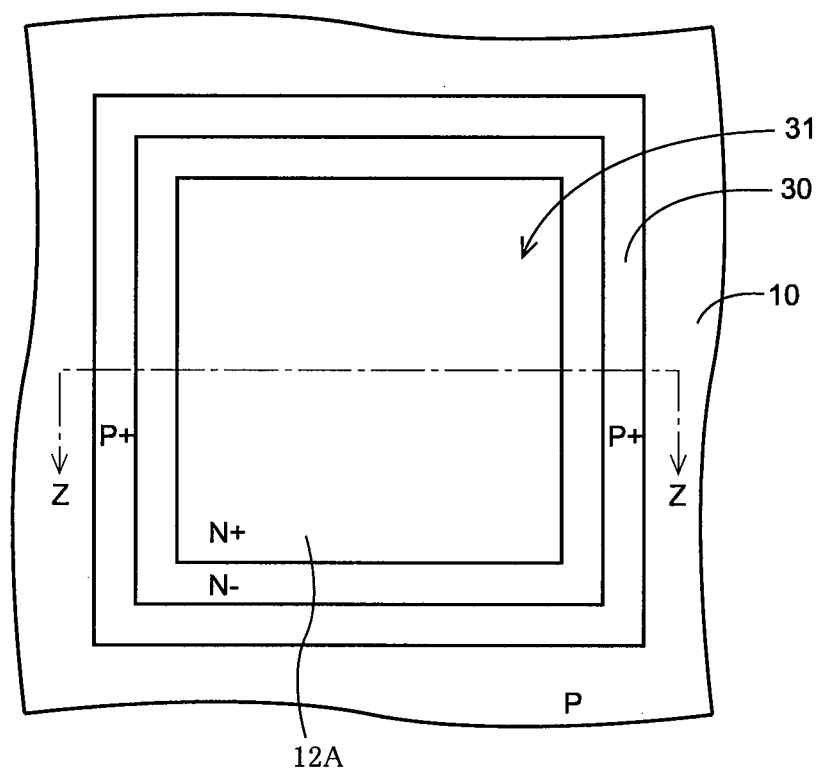
FIG. 5 is a plan view showing the manufacturing method of the semiconductor device according to the embodiment of this invention.

At that time, lateral extension of the P+-type upper isolation region 29 is suppressed because some of the boron impurities (B) are compensated by the phosphorus impurities (P) from the N-type impurity regions 28. The isolation region 30 is ring-shaped on a plan view as shown in FIG. 5, and a region of the epitaxial layer 21 surrounded by the isolation region 30 makes an island region 31. A plurality of island regions 31 is formed in a semiconductor integrated circuit. Note that FIG. 3C is a cross-sectional view showing a section Z-Z in FIG. 5.

The P-type impurity region 25 and the N-type impurity regions 28 are formed adjacent to and self-aligned with each other, since the N-type impurity regions 28 are formed so as to overlap regions where the P-type impurity region 25 has been formed and then removed by the partial etching as described above. With this, impurity profiles in the P-type impurity region 25 and the N-type impurity regions 28 are consistent even when the fourth photoresist 26 is misaligned to some extent with the third photoresist 24, and a variation in impurity profile in the P+-type isolation region 30 after the thermal diffusion can be suppressed.

As a result of using boron (B) and phosphorus (P) as the impurities, the impurity profile in the upper isolation region 29 after the thermal diffusion makes a width of the upper isolation region 29 smaller at its upper end than at its lower end, as shown in FIG. 3C. The reason is the same as in the case of the lower isolation region 22. That is, the diffusion coefficient of boron (B) in silicon is larger than the diffusion coefficient of phosphorus (P) in silicon at 1100° C. and above. The difference between the diffusion coefficients is even greater at 1180° C.

Since boron (B+) diffuses faster than phosphorus (P+), the width of the upper isolation region 29 is greater at deeper location in the epitaxial layer 21. On the other hand, boron (B) is more likely compensated by phosphorus (P) at shallower location in the epitaxial layer 21 because phosphorus (P) diffuses slower than boron (B). With this, lateral extension of the upper isolation region 29 is suppressed to reduce its width.

To describe a shape of the isolation region 30 as a whole, its width is smaller at both the upper and lower ends than at the center. Such a profile characteristic to the isolation region 30 is effective in reducing a pattern area of the isolation region 30 and in reducing a size of a semiconductor integrated circuit that incorporates the semiconductor device of this invention.

Figure 4A:
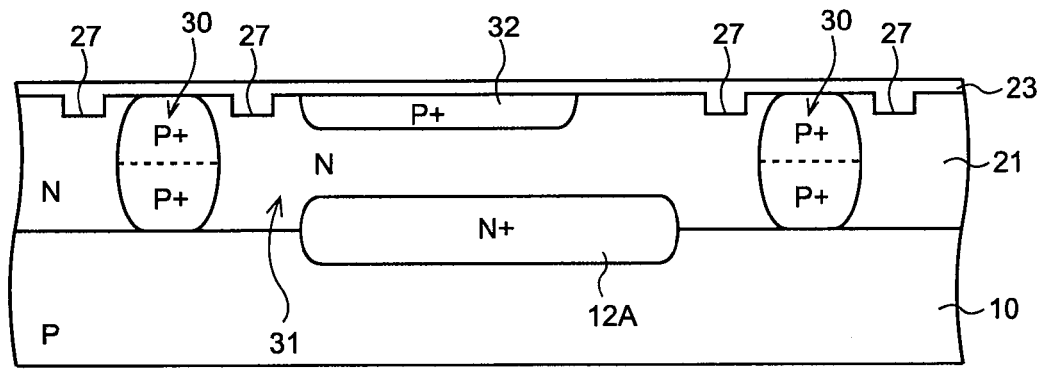
FIGS. 4A, 4B and 4C are cross-sectional views showing the manufacturing method of the semiconductor device according to the embodiment of this invention.
Figure 4B:
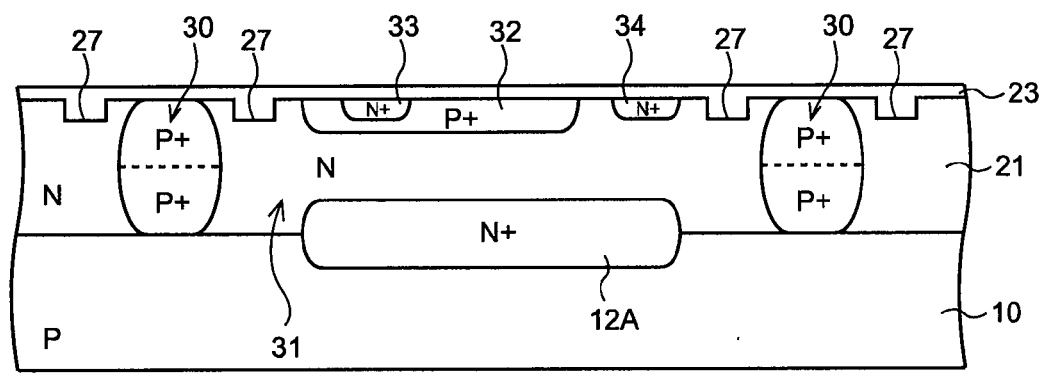

Next, process steps to form a bipolar transistor in the island region 31 will be described referring to FIGS. 4A, 4B and 4C. A P+-type base layer 32 is formed in the surface of the epitaxial layer 21, which makes the island region 31, by ion implantation and subsequent thermal diffusion, as shown in FIG. 4A. An N+-type emitter layer 33 is formed in a surface of the base layer 32 by ion implantation, while an N+-type collector layer 34 is simultaneously formed in the surface of the epitaxial layer 21 adjacent the base layer 32 by ion implantation, as shown in FIG. 4B.

Figure 4C:
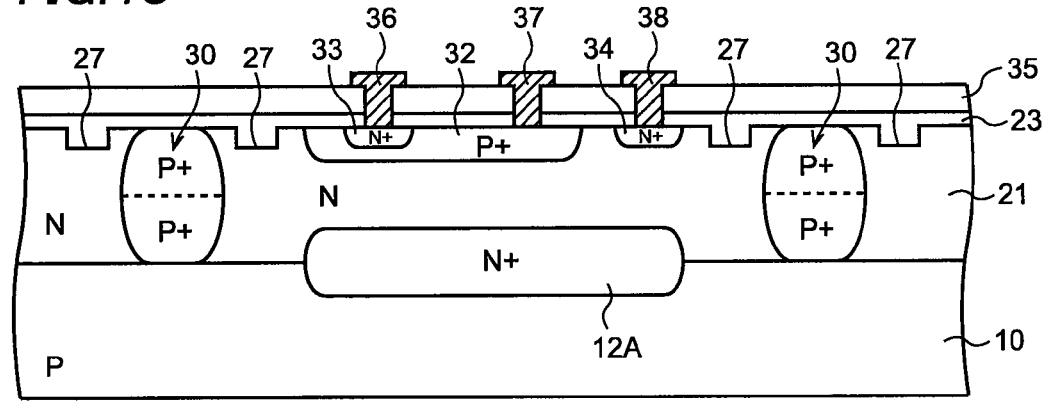

Then, an interlayer insulation film 35 made of a silicon oxide film is formed all over the silicon oxide film 23 by CVD (Chemical Vapor Deposition), as shown in FIG. 4C. After that, contact holes are formed by selectively etching the silicon oxide film 23 and the interlayer insulation film 35 on the N+-type emitter layer 33, the P+-type base layer 32 and the N+-type collector layer 34. Then, there are formed an emitter electrode 36, a base electrode 37 and a collector electrode 38 that are electrically connected with the N+-type emitter layer 33, the P+-type base layer 32 and the N+-type collector layer 34, respectively, through corresponding each of the contact holes. As a result, an NPN-type bipolar transistor is formed in the island region 31.

While the boron ions (B+) are implanted into the surface of the epitaxial layer 12 in the process steps to form the upper isolation region 29 in the embodiment described above, the boron ions (B+) may be implanted into the silicon oxide film 23 and then thermally diffused into the epitaxial layer 21. In the process steps to form the lower isolation region 22, the process step to implant the phosphorus ions (P+) may be omitted.

Because the lateral extension of the isolation region 30 is suppressed with the semiconductor device and its manufacturing method according to the embodiment of this invention, the pattern area of the semiconductor element including the isolation region 30 is reduced and the semiconductor integrated circuit can be reduced in size.

Needless to say, this invention is not limited to the embodiment described above and may be modified within the scope of the invention. For example, the thickness of the silicon oxide film 23, the widths of the first opening K1 through the fourth opening K4, the conditions of the ion implantation, the conditions of the thermal diffusion and the like may be modified as appropriate. Also, not limited to the NPN-type bipolar transistor, other semiconductor elements may be formed in the island region 31.

Since the lateral extension of the isolation region can be suppressed according to the embodiment of this invention, the isolation region can be formed with a reduced pattern area and a semiconductor integrated circuit can be reduced in size. The embodiment of this invention can be implemented at a low cost because additional process steps required by it are only introducing the impurities for compensation and etching the semiconductor substrate or the insulation film.

With the method described above, lateral extension of the upper isolation region is suppressed because some of the impurities of the first conductivity type diffused from the first impurity region are compensated by the impurities of the second conductivity type diffused from the second impurity region. As a result, the area of the isolation region is reduced to realize size reduction of a semiconductor integrated circuit. In addition, since the isolation region is formed of the upper isolation region and the underlying lower isolation region connected with each other by the thermal diffusion, the thermal diffusion can be carried out at a reduced temperature to further suppress the lateral extension of the isolation region. Furthermore, the pattern area of the isolation region on a surface of the semiconductor layer can be reduced and a semiconductor integrated circuit that includes the semiconductor device can be reduced in size, because the width of the upper end of the isolation region and the width of the lower end of the isolation region are smaller than the width of the center of the isolation region. In addition, since the width of the lower end of the isolation region is small, the pattern area can be reduced while avoiding interference between the isolation region and other diffusion layers such as a buried layer.

What is claimed is:
1. A semiconductor device comprising:
   a semiconductor substrate of a first general conductivity type;
   a semiconductor layer of a second general conductivity type disposed on the semiconductor substrate;
   an isolation region of the first general conductivity type formed in the semiconductor layer so as to surround and electrically isolate a portion of the semiconductor layer;
   a first depressed portion and a second depressed portion that are formed in the semiconductor layer of the second general conductivity type so as to be adjacent to the isolation region of the first general conductivity type but not in direct contact with the isolation region, the first depressed portion being disposed on one side of the isolation region, and the second depressed portion being disposed on another side of the isolation region, wherein a width of an upper end of the isolation region and a width of a lower end of the isolation region are smaller than a width of a center of the isolation region, and the first depressed portion and the second depressed portion include no metal wiring.

2. The semiconductor device of claim 1, further comprising a semiconductor element disposed in the semiconductor layer.

3. The semiconductor device of claim 2, wherein the first depressed portion is formed between the isolation region and the semiconductor element.

4. The semiconductor device of claim 2, wherein the semiconductor element comprises a bipolar transistor and the semiconductor layer is configured to operate as a collector.

5. The semiconductor device of claim 1, wherein the width of the center of the isolation region is smaller than a distance between the first depressed portion and the second depressed portion.

6. The semiconductor device of claim 1, further comprising a buried layer of the second general conductivity type disposed between the semiconductor substrate and the semiconductor layer.

7. The semiconductor device of claim 1, wherein the isolation region is of a square shape in plan view.

8. The semiconductor device of claim 3, further comprising a buried layer of the second general conductivity type disposed between the semiconductor substrate and the semiconductor layer, and wherein, in a sectional view of the semiconductor device, a lateral length of the buried layer is smaller than a distance between two sections of the first depressed portion.

\* \* \* \* \*